(12) United States Patent  (10) Patent No.: US 7,677,394 B2
Conarro  (45) Date of Patent: Mar. 16, 2010

(54) WAFER SHIPPING CONTAINER

(75) Inventor: Patrick Rooney Conarro, Colorado Springs, CO (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 10/339,150

(22) Filed: Jan. 9, 2003

(65) Prior Publication Data
US 2004/0134828 A1 Jul. 15, 2004

(51) Int. Cl.
*B65D 85/00* (2006.01)
(52) U.S. Cl. .................. 206/711; 206/710; 206/454
(58) Field of Classification Search .......... 206/710, 206/711, 832, 833, 445, 454, 515; 211/41.14, 211/41.18; 220/4.24
See application file for complete search history.

(56) References Cited

U.S. PATENT DOCUMENTS

| | | | | |
|---|---|---|---|---|
| 4,061,228 A | * | 12/1977 | Johnson | 206/454 |
| 4,079,835 A | * | 3/1978 | Kendig | 206/416 |
| 4,793,488 A | * | 12/1988 | Gregerson | 206/711 |
| 5,207,324 A | | 5/1993 | Kos | 206/334 |
| 5,553,711 A | | 9/1996 | Lin et al. | 206/710 |
| 5,638,958 A | * | 6/1997 | Sanchez | 206/710 |
| 5,788,082 A | * | 8/1998 | Nyseth | 206/711 |
| 5,803,269 A | * | 9/1998 | Jacoby et al. | 206/711 |
| 6,006,919 A | | 12/1999 | Betsuyaki | 206/411 |
| 6,010,008 A | * | 1/2000 | Nyseth et al. | 206/711 |
| 6,010,009 A | * | 1/2000 | Peterson et al. | 206/711 |
| 6,039,186 A | * | 3/2000 | Bhatt et al. | 206/711 |
| 6,092,981 A | * | 7/2000 | Pfeiffer et al. | 206/710 |
| 6,098,809 A | | 8/2000 | Okada et al. | 206/711 |
| 6,145,673 A | * | 11/2000 | Burrows et al. | 211/41.18 |
| 6,193,090 B1 | | 2/2001 | Connors et al. | 220/4.24 |
| 6,216,874 B1 | * | 4/2001 | Bores et al. | 206/711 |
| 6,237,771 B1 | | 5/2001 | Haq | 206/454 |
| 6,283,701 B1 | * | 9/2001 | Sundar et al. | 414/744.5 |
| 6,287,112 B1 | * | 9/2001 | Van Voorst Vader et al. | 211/41.18 |
| 6,398,032 B2 | * | 6/2002 | Fosnight et al. | 206/711 |
| 6,401,929 B2 | | 6/2002 | Rauchut et al. | 206/710 |
| 6,446,806 B1 | | 9/2002 | Ohori et al. | 206/454 |
| 2003/0066810 A1 | * | 4/2003 | Chu | 211/41.18 |

* cited by examiner

*Primary Examiner*—J. Gregory Pickett
(74) *Attorney, Agent, or Firm*—Perman & Green, LLP; Richard Pickreign, Esq.

(57) ABSTRACT

A wafer shipping container has a first housing subcontainer. A second housing subcontainer mates with the first housing subcontainer to form a housing. The first housing subcontainer is substantially the same as the second housing subcontainer. A process carrier fits inside the housing.

13 Claims, 5 Drawing Sheets

WAFER SHIPPING CONTAINER

FIELD OF THE INVENTION

The present invention relates generally to the field of semiconductors and more particularly to a wafer shipping container.

BACKGROUND OF THE INVENTION

Semiconductor wafers continue to grow in size. Presently the largest wafers are 300 mm. Once the wafers have been etched with circuitry they are thinned. These thinned wafers are extremely fragile and each wafer can easily be worth tens of thousands of dollars. Transporting these wafers from the clean room processing area to the non-clean room slicing and dicing and packaging part of the factory requires a container. Present containers have several limitations. For instance, none of the present containers allow for a batch transfer of wafers from one carrier to another carrier. Present designs all require moving each wafer one at a time. Present containers take up a substantially amount of space when not in use. These limitations significantly reduce the usefulness of present wafer shipping containers.

Thus there exists a need for a wafer shipping container that allows batch transfer of wafers and that does not take up a lot of space when they are not in use.

SUMMARY OF INVENTION

A wafer shipping container has a housing having a top portion and a bottom portion. A process carrier has a top plate, a lower plate, and a pair of side walls. The process carrier has an open front side and a substantially open back side. The process carrier fits inside the housing. A film frame is designed to slide inside the process carrier.

In one embodiment, the process carrier further includes a pair of guides. One of the pair of guides is attached to one of the pair of side walls and each of the pair of guides extending the length of the pair of side walls. In one embodiment, the process carrier has a static dissipative design. In one embodiment, the process carrier has a plurality of kinematic coupling grooves. In another embodiment, the process carrier has a film frame grounding design. In yet another embodiment, the kinematic coupling grooves are formed with a nickel coated aluminum.

In one embodiment, a molded cushion fits between the housing and the process carrier.

In one embodiment, a wafer shipping container has a process carrier that provides access by semiconductor processing equipment at a front side and at a back side. The process carrier has a pair of guides that form a pair of side walls of the process carrier. A housing contains the process carrier and has a first portion and a second portion. In one embodiment, the first portion is stackable in the second portion of the housing.

In another embodiment, the pair of guides are formed of a conductive plastic. In one embodiment, the conductive plastic is PBT (PolyButylene Terephthalate).

In one embodiment, the process carrier has a metallic top side and a metallic bottom side attached to the pair of guides. In another embodiment, the metallic top side has a kinematic coupling registration system.

In one embodiment, a wafer shipping container has a first housing subcontainer. A second housing subcontainer mates with the first housing subcontainer to form a housing. The first housing subcontainer is substantially the same as the second housing subcontainer. A process carrier fits inside the housing. In one embodiment, the first housing subcontainer is stackable inside the second housing subcontainer.

In one embodiment, the process carrier is static dissipative. In another embodiment, a film frame fits inside the process carrier. In one embodiment, the process carrier has an open front face and a substantially open back face.

DETAILED DESCRIPTION OF THE DRAWING

Figure 1:
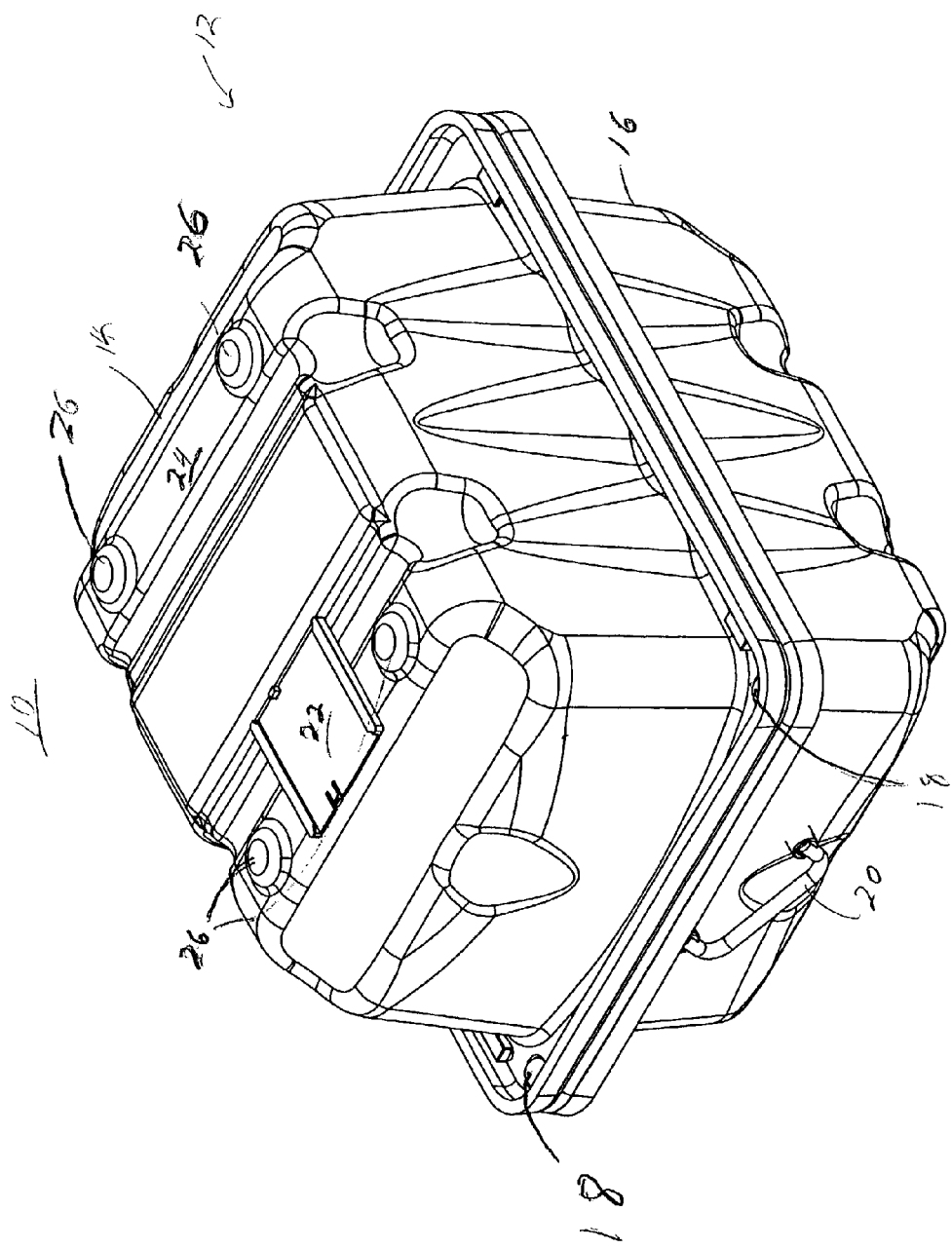
FIG. 1 is a top left perspective of a wafer shipping container in accordance with one embodiment of the invention.

FIG. 1 is a top left perspective of a wafer shipping container 10 in accordance with one embodiment of the invention. Only the housing 12 can be seen in this drawing. The housing has a top portion or first portion 14 and a bottom portion or second portion 16. In one embodiment, the top portion 14 and bottom portion 16 are substantially the same and therefor are interchangeable. In addition, this allows the first portion 14 to be stacked inside the second portion 16. The top portion has clips 18 that attach the top portion 14 to the lower portion 16. Other attachment devices may also be used. The lower portion 16 has a handle 20 or handles that may be used to carry the container 10. The top portion 14 has computer disk holder 22 and a bar code bench 24. The bar code bench 24 is an ideal location to place a bar code sticker. A plurality of pads 26 hold the housing off the ground. In one embodiment the top portion 14 and the lower portion 16 are made of engineering plastics, such as ABS (acrylonitrile butadiene styrene) with UV (ultra-violet light) protection.

Figure 2:
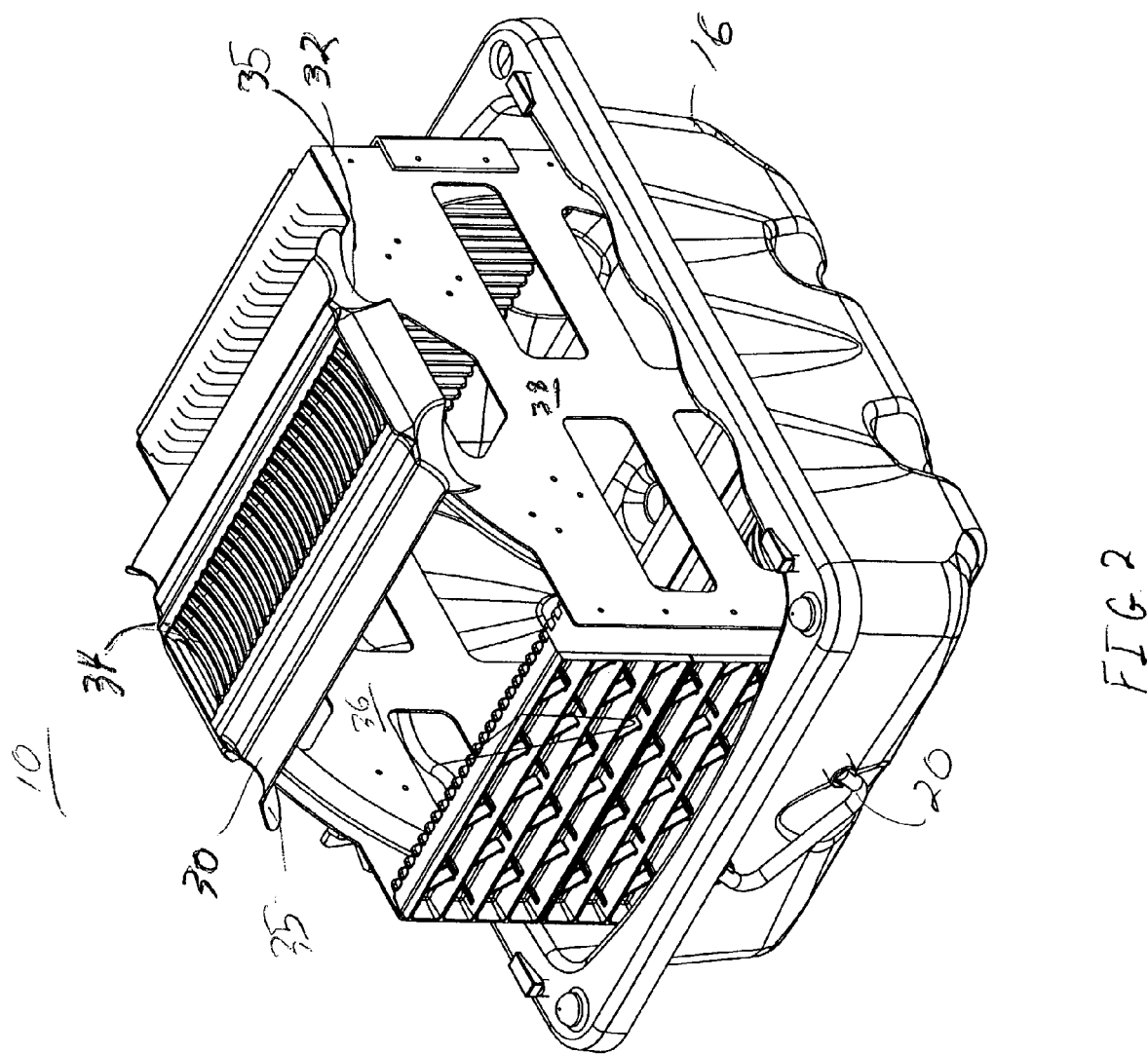
FIG. 2 is a top left perspective of a wafer shipping container with a first housing portion removed in accordance with one embodiment of the invention.

FIG. 2 is a top left perspective of a wafer shipping container 10 with a first housing portion removed in accordance with one embodiment of the invention. Inside the housing 12 is a molded cushion 30 that fits between the housing 12 and a process carrier 32. The cushion 30 has a plurality of slots 34 that mates with the film frames loaded in the process carrier 32. A pair of lips 35 extend over a top plate 36 and lower plate 38 of the process carrier 32.

Figure 3:
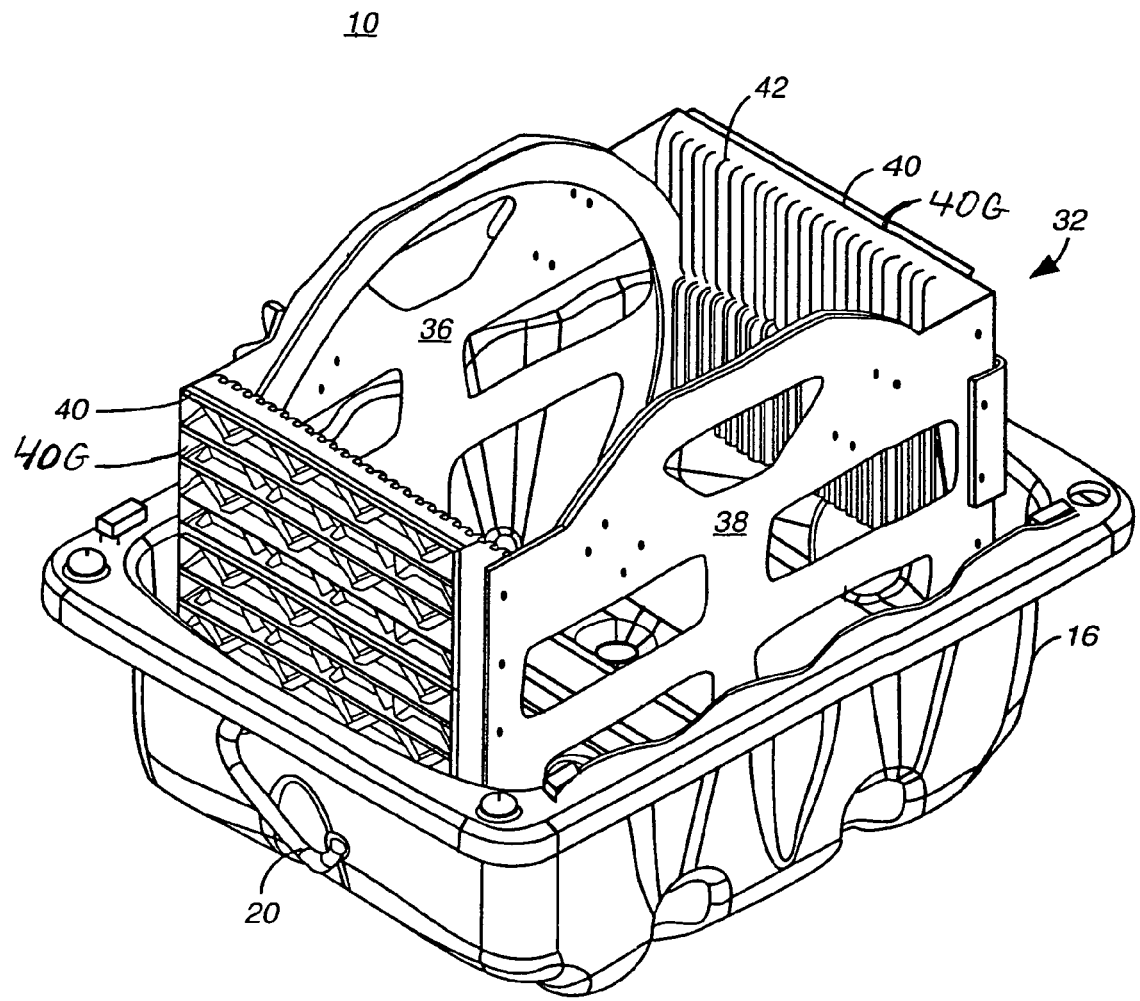
FIG. 3 is a top left perspective of a wafer shipping container with a first housing portion and a cushion removed in accordance with one embodiment of the invention.

FIG. 3 is a top left perspective of a wafer shipping container 10 with a first housing portion and a cushion removed in accordance with one embodiment of the invention. In one embodiment, a second cushion is placed below the process carrier 32 and the bottom portion 16 of the housing 12. The process carrier 32 has a pair of side walls 40. In one embodiment, the pair of side walls 40 are a pair of guides 40G. The guides 40G have a plurality of grooves 42 in which the film frames fit. The process carrier 32 fits snugly inside of the housing as can be seen from the drawing. This insures that the process carrier 32 does not bounce around inside of the housing 12.

Figure 4:
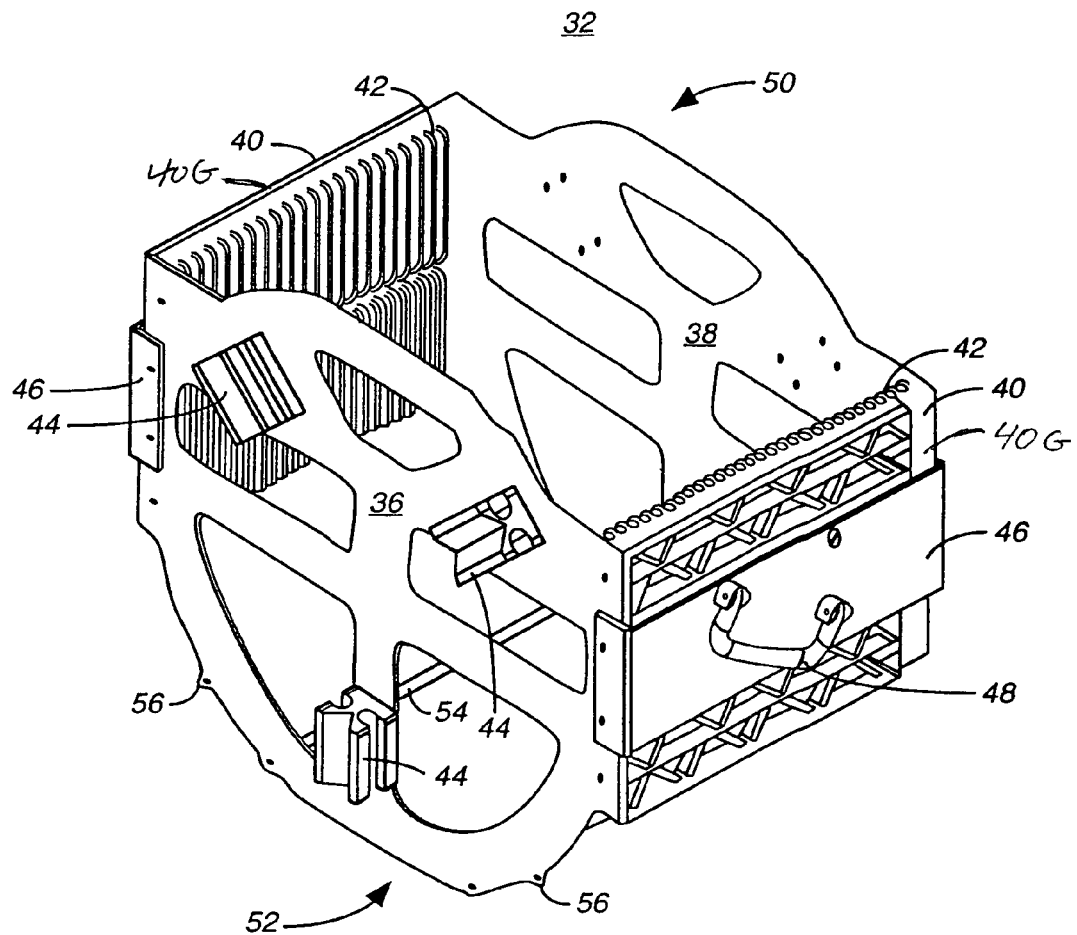
FIG. 4 is a top left perspective of a process carrier in accordance with one embodiment of the invention.

FIG. 4 is a top left perspective of a process carrier 32 in accordance with one embodiment of the invention. The process carrier 32 has a top plate 36 and a lower plate 38. In one embodiment, the top plate 36 is metallic and the bottom plate 38 is also metallic. In one embodiment, the top and bottom plate 36, 38 are made of aluminum. The process carrier 32 has a pair of guides 40G that connect to the top plate 36 and the lower plate 38 and form the side walls. Note that the pair of guides 40G extend the length of the side walls. This helps in allowing a batch transfer of wafers from one carrier to another carrier. In one embodiment, the side walls are formed of a conductive plastic. In one embodiment, the conductive plastic is PBT (PolyButylene Terephthalate). The top plate 36 and lower plate 38 have a plurality of kinematic coupling grooves 44. The kinematic coupling grooves 44 allow the process carrier 32 to be handled by production equipment. This allows the process carrier 32 to be used on the production line. As a result, the wafer need not be removed from the process carrier 32 to be processed. In on embodiment, the kinematic coupling grooves 44 are nickel coated aluminum.

Top plate 36 and lower plate 38 each have nipples 56 for registering the process carrier 32 in the housing 12. The nipples 56 are located on the edges of the top plate 36 and lower plate 38. The nipples 56 register the process carrier 32 in the housing 12. FIGS. 1, 2, and 3 illustrate how the process carrier 32 fits inside the housing 12. The process carrier 32 may sit within the bottom portion 16 of the housing in the absence of the top portion 14, or may be completely enclosed by housing 12 when the top portion and bottom portion are mated together to form the full housing with the process carrier inside.

The process carrier 32 has a pair of plates 46 covering the guides 40. A handle 48 is attached to the plate 46. This allows the process carrier to be easily handled by a person. The plates 46 are made of metal in one embodiment. The process carrier 32 has an open front face 50 and a substantially open back face 52. A film frame grounding strip 54 or design is the only item covering the back face 52. The film frame grounding strip 54 is made of metal in one embodiment. The open front and back face allow access to the front and back of the process carrier 32 by semiconductor processing equipment. This design also facilitates a batch transfer to or from the process carrier 32. A pair of nipples 56 on the plates 36, 38 register the process carrier 32 in the housing 12. As may be realized from FIG. 4 the nipples may be rounded protrusions. In addition, the nipples 56 allow additional bars similar to the frame grounding strip 54 to be placed on the back of the process carrier 32.

The metallic plates 36, 38, 46, conductive plastic 40 and grounding strips 40 are all part of the static dissipative design of the process carrier. The nickel coated aluminum couplings 44 are also part of the static dissipative design. This significantly reduces the chances of damage to the semiconductor wafers due to static discharge.

Figure 5:
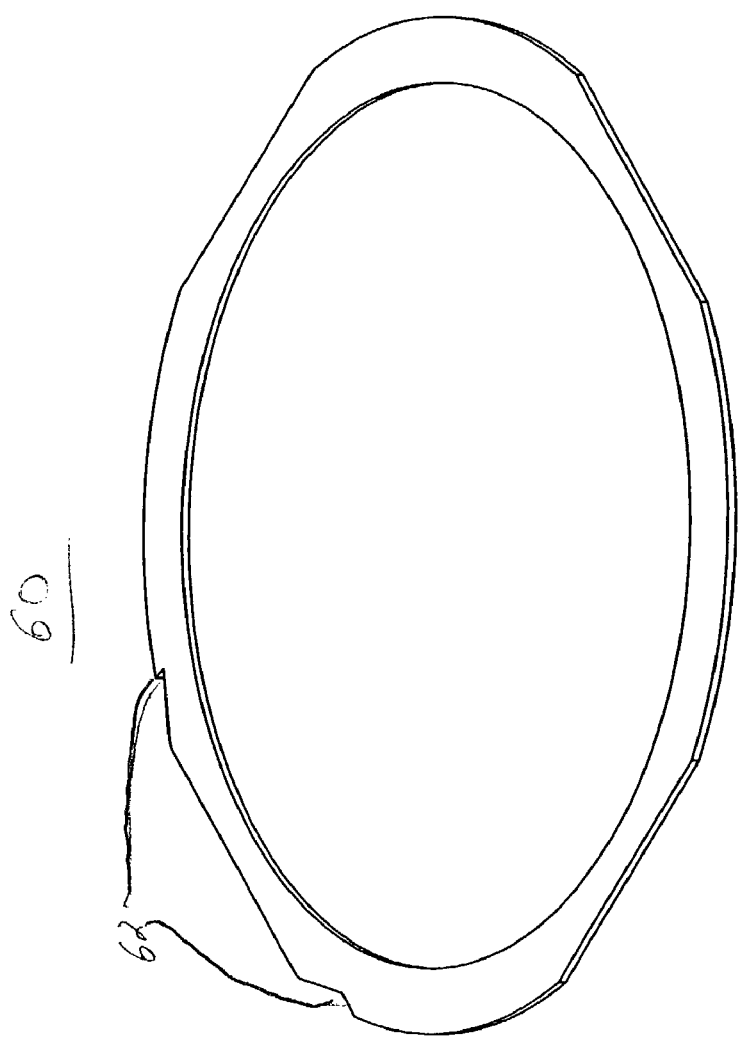
FIG. 5 is a perspective view of a film frame in accordance with one embodiment of the invention.

FIG. 5 is a perspective view of a film frame 60 in accordance with one embodiment of the invention. The film frame 60 holds the semiconductor wafers in the process carrier 32. The film frame 60 has a pair of registration grooves 62 that allow the film frame 60 to be aligned with other equipment. In one embodiment, the film frame 60 is formed of metal.

Semiconductor processing plastic is placed over the film frame 60 with the adhesive side against the film frame 60. The semiconductor wafer is then placed against the adhesive side of the plastic so that the wafer does not touch the film frame 60. The film frame 60 may then be placed in the grooves 42 of the process carrier 32 for transportation.

There has been described a wafer shipping container that allows batch transfer of wafers to or from the process carrier. The process carrier of the system may be used on the production line. In addition, the two parts of the external housing are substantially the same and may be stacked within each other to reduce the space the housing takes up while in storage.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A wafer shipping container comprising:
   a housing having a top portion and a bottom portion;
   a process carrier having a top plate, a lower plate, a pair of side walls, and an open front side, the process carrier fitting inside the housing; and
   a film frame designed to slide inside the process carrier;
   wherein the process carrier has first kinematic registration members on the edges of the top and lower plates, the first kinematic registration members being rounded protrusions configured to register the process carrier in the housing, and second registration members for registering the process carrier to production equipment, and wherein the first kinematic registration members and second registration members are distinct and separate from one another.

2. The wafer shipping container of claim 1, further including a pair of guides, wherein one of the pair of guides is attached to one of the pair of side walls, each of the pair of guides extending the length of the pair of side walls.

3. The wafer shipping container of claim 1, wherein the process carrier is a static dissipative system.

4. The wafer shipping container of claim 1, further including a molded cushion fitting between the housing and the process carrier.

5. The wafer shipping container of claim 3, wherein the second registration members comprise a plurality of kinematic coupling grooves.

6. The wafer shipping container of claim 5, wherein the process carrier has a film frame ground.

7. The wafer shipping container of claim 5, wherein the kinematic coupling grooves are formed with a nickel coated aluminum.

8. The wafer shipping container of claim 1 wherein the process carrier has a substantially open back side and wherein the open front side and back side of the process carrier form a wafer batch transfer access at the front side and back side of the carrier.

9. A wafer shipping container comprising:
   a process carrier providing semiconductor processing equipment access at a front side and at a back side of the process carrier;
   the process carrier having a pair of guides that form a pair of side walls of the process carrier; and
   a housing containing and completely enclosing the process carrier, the housing having a first portion and a second portion;
   wherein the semiconductor processing equipment access at both the front and back side is sized and shaped for facilitating batch wafer transfer to and from the process carrier; and
   wherein the process carrier has a first kinematic registration system having rounded protrusions configured to register the process carrier to the housing, and a second registration system for registering the process carrier to production equipment, and wherein the first kinematic registration system and second registration system are distinct from one another and the second registration system comprises a kinematic coupling registration system for kinematic coupling of the process carrier to production equipment.

10. The wafer shipping container of claim 9, wherein the first portion is stackable in the second portion of the housing.

11. The wafer shipping container of claim 9, wherein the pair of guides are formed of a conductive plastic.

12. The wafer shipping container of claim 11, wherein the conductive plastic is PBT (PolyButylene Terephthalate).

13. The wafer shipping container of claim 9, wherein the process carrier has a metallic top side and a metallic bottom side attached to the pair of guides.

* * * * *